United States Patent
Yamada et al.

(10) Patent No.: US 12,031,931 B2
(45) Date of Patent: Jul. 9, 2024

(54) INSPECTION STRUCTURE AND INSPECTION METHOD

(71) Applicant: Nippon Telegraph and Telephone Corporation, Tokyo (JP)

(72) Inventors: Yuki Yamada, Tokyo (JP); Masahiro Nada, Tokyo (JP); Fumito Nakajima, Tokyo (JP); Hideaki Matsuzaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 844 days.

(21) Appl. No.: 17/047,942

(22) PCT Filed: Apr. 9, 2019

(86) PCT No.: PCT/JP2019/015431
§ 371 (c)(1),
(2) Date: Oct. 15, 2020

(87) PCT Pub. No.: WO2019/203058
PCT Pub. Date: Oct. 24, 2019

(65) Prior Publication Data
US 2021/0109051 A1    Apr. 15, 2021

(30) Foreign Application Priority Data
Apr. 18, 2018    (JP) .................................. 2018-079625

(51) Int. Cl.
*G01N 27/04*    (2006.01)
*G01R 1/067*    (2006.01)
(Continued)

(52) U.S. Cl.
CPC ....... *G01N 27/04* (2013.01); *H01L 21/76802* (2013.01); *H01L 21/76877* (2013.01); *H01L 22/34* (2013.01); *H01L 23/5226* (2013.01)

(58) Field of Classification Search
CPC ........ G01R 1/067; G01R 1/073; G01N 27/04; H01L 21/66; H01L 21/4763; H01L 23/538; H01L 23/58
See application file for complete search history.

(56) References Cited

U.S. PATENT DOCUMENTS

2003/0034558 A1* 2/2003 Umemura ............... H01L 22/34
257/734
2010/0252935 A1* 10/2010 Lee ................... H01L 21/76898
257/777

FOREIGN PATENT DOCUMENTS

JP    2000003947 A    1/2000
JP    2003133377 A    5/2003
(Continued)

*Primary Examiner* — Neel D Shah
(74) *Attorney, Agent, or Firm* — SLATER MATSIL, LLP (57) ABSTRACT

A structure includes an insulating layer on a semiconductor substrate, and a first through-hole and a second through-hole formed in the insulating layer. The second through-hole is formed in the insulating layer at a set distance from the first through-hole. The structure also includes a first electrode portion and a second electrode portion. The first electrode portion is formed by filling the first through-hole. The first electrode portion includes a probing pad on the insulating layer. The probing pad is wider than an opening area of the first through-hole. The second electrode portion is formed by filling the second through-hole. The second electrode portion includes a probing pad on the insulating layer. The probing pad is wider than an opening area of the second through-hole.

13 Claims, 7 Drawing Sheets

(51) Int. Cl.
*G01R 1/073* (2006.01)
*H01L 21/66* (2006.01)
*H01L 21/768* (2006.01)
*H01L 23/522* (2006.01)

(56) References Cited

FOREIGN PATENT DOCUMENTS

| | | |
|---|---|---|
| JP | 2004186477 A | 7/2004 |
| JP | 2010003832 A | 1/2010 |

* cited by examiner

INSPECTION STRUCTURE AND INSPECTION METHOD

CROSS-REFERENCE TO RELATED APPLICATIONS

This application is a national phase entry of PCT Application No. PCT/JP2019/015431, filed on Apr. 9, 2019, which claims priority to Japanese Application No. 2018-079625, filed on Apr. 18, 2018, which applications are hereby incorporated herein by reference.

TECHNICAL FIELD

The present invention relates to a structure for inspection and an inspection method for inspecting isolation residue remaining in a through-hole formed in an insulating layer formed on a semiconductor substrate.

BACKGROUND

Recent semiconductor electronic devices involves formation of an insulating layer for the purpose of surface protection or a multilayer structure including an interconnection and an insulating layer for the purpose of high integration. In the semiconductor electronic device, the insulating layer is etched to form a through-hole therein to connect between a semiconductor substrate and an interconnection and between interconnections.

Figure 6A:
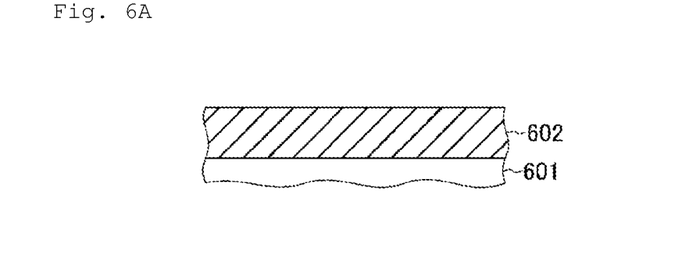
FIG. 6A is a cross-sectional view in each step for illustrating a method for making a structure in which a semiconductor substrate and an interconnection are connected via a through-hole.
Figure 6B:
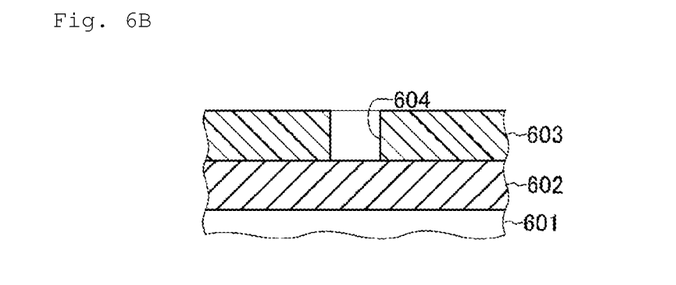
FIG. 6B is a cross-sectional view in each step for illustrating a method for making a structure in which a semiconductor substrate and an interconnection are connected via a through-hole.

A description is given below of a general technology for connection between a semiconductor substrate and an interconnection via a through-hole. First, as shown in FIG. 6A, an insulating material such as $SiO_2$ or SiN is deposited on a semiconductor substrate 601 via techniques such as CVD and sputter to form an insulating layer 602. Next, photoresist is applied onto the insulating layer 602 to form a resist film, which is then patterned by a well-known lithography technology to form a mask pattern 603 including an opening pattern 604 on the insulating layer 602, as shown in FIG. 6B.

Figure 6C:
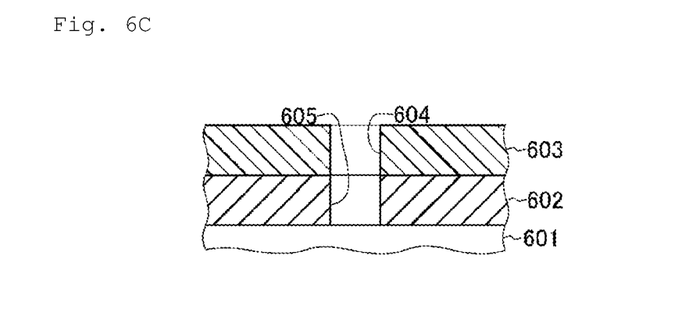
FIG. 6C is a cross-sectional view in each step for illustrating a method for making a structure in which a semiconductor substrate and an interconnection are connected via a through-hole.
Figure 6D:
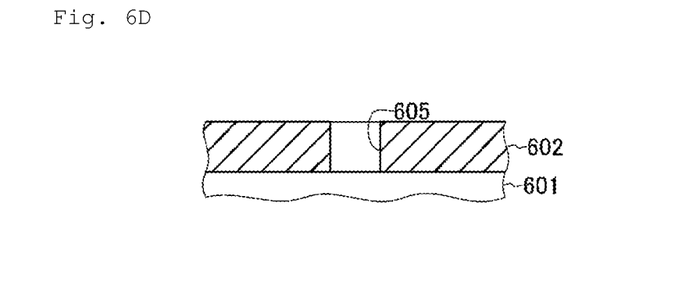
FIG. 6D is a cross-sectional view in each step for illustrating a method for making a structure in which a semiconductor substrate and an interconnection are connected via a through-hole.
Figure 6E:
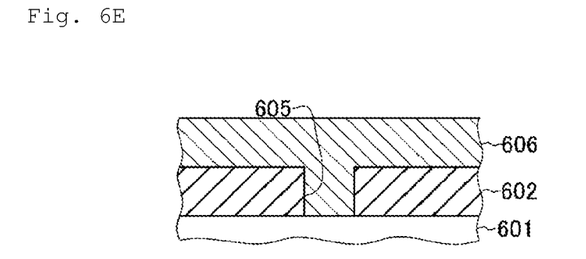
FIG. 6E is a cross-sectional view in each step for illustrating a method for making a structure in which a semiconductor substrate and an interconnection are connected via a through-hole.

Then, with the mask pattern 603 as a mask, the insulating layer 602 is etched by an etching technology such as reactive ion etching to form a through-hole 605, as shown in FIG. 6C. Then, the mask pattern 603 is removed such as by cleaning (FIG. 6D). Next, a conductor such as metal is deposited in the through-hole 605 to fill the inside thereof by well-known technologies such as vacuum deposition, sputtering, and plating to form an interconnection layer 606, as shown in FIG. 6E.

In the above interconnection manufacturing, if the etching to form the through-hole is excessive, a damage occurs in the semiconductor substrate under the insulating layer or the interconnection. So the over-etching needs to be avoid. Meanwhile, if the etching to form the through-hole is insufficient, a part of the insulating layer may remain (a remaining insulating layer occurs) in the bottom surface of the through-hole, thus causing poor connection between the interconnections. In particular, for a process on the entire wafer surface, a remaining insulating layer often occurs because of variation in the insulating layer thickness in a wafer surface and the etching rate.

Therefore, it is necessary to check for the presence or absence of a remaining insulating layer in the through-hole before forming the interconnection. Conventionally, observation under an electron microscope or the like has been used (see PTL 1). The electron microscope detects secondary electrons emitted from the observation object by electron irradiation. The emission efficiency depends on the work function of the observation object material or the like. Therefore, whether the remaining insulating layer is present or absent changes the emission efficiency of the secondary electron, which enables inspection for determining the presence or absence of the remaining insulating layer using the image contrast.

CITATION LIST

Patent Literature

PTL 1—Japanese Patent Application Publication No. 2004-186477

SUMMARY

Technical Problem

If a remaining insulating layer occurs, the inside of the through-hole should additionally be etched before forming the interconnection. The thickness of the remaining insulating layer needs to be checked (measured) to determine various process conditions such as etching time and output.

Unfortunately, it is difficult to check the thickness of the remaining insulating layer by conventional observation under an electron microscope. In addition, as a thickness determination method of the remaining insulating layer, it is considered to observe the cross-section of a through-hole portion under a transmission electron microscope. This method allows visual determination of the thickness of the remaining insulating layer. General observation under a transmission electron microscope requires a sample for observation to be made by cleaving the semiconductor wafer. However, this will make it impossible to perform wafer processing after the observation under a transmission electron microscope. Therefore, observation under a transmission electron microscope is not appropriate during processing.

As described above, it has been practically difficult to determine the presence or absence of a remaining insulating layer non-destructively and high accurately and check the thickness of the remaining insulating layer in forming a through-hole that is necessary in manufacturing and processing of a semiconductor electronic device.

Embodiments of the present invention are provided to solve the above problems and the purpose thereof is to provide the ability to check a remaining insulating layer in the through-hole non-destructively.

Means for Solving the Problem

An structure for inspection according to embodiments of the present invention includes an insulating layer formed on a semiconductor substrate; a first through-hole formed in the insulating layer; a second through-hole formed in the insulating layer at a set distance from the first through-hole; a first electrode portion formed by filling the first through-hole, the first electrode portion including a probing pad on the insulating layer, the probing pad being wider than an opening area of the first through-hole; and a second electrode portion formed by filling the second through-hole, the second electrode portion including a probing pad on the insulating layer, the probing pad being wider than an opening area of the second through-hole.

The structure for inspection further includes a conductor layer formed between the semiconductor substrate and the insulating layer, wherein the conductor layer is formed in a region including locations at which the first through-hole and the second through-hole are formed.

The structure for inspection further includes a trench portion formed in the insulating layer between the first through-hole and the second through-hole.

The structure for inspection further includes: a third through-hole formed in the insulating layer at a set distance from the first through-hole; a fourth through-hole formed in the insulating layer at a set distance from each of the third through-hole and the second through-hole; and a third electrode portion formed by filling the third through-hole and the fourth through-hole, the third electrode portion including a probing pad on the insulating layer, the probing pad being wider than an opening area of the third or fourth through-hole, wherein the conductor layer includes: a first conductor layer formed in a region including locations at which the first through-hole and the third through-hole are formed; and a second conductor layer insulated and isolated from the first conductor layer, the second conductor layer being formed in a region including locations at which the second through-hole and the fourth through-hole are formed.

In addition, a method of inspection according to embodiments of the present invention, the structure for inspection including: an insulating layer formed on a semiconductor substrate; a first through-hole formed in the insulating layer; a second through-hole formed in the insulating layer at a set distance from the first through-hole; a first electrode portion formed by filling the first through-hole, the first electrode portion including a probing pad on the insulating layer, the probing pad being wider than an opening area of the first through-hole; and a second electrode portion formed by filling the second through-hole, the second electrode portion including a probing pad on the insulating layer, the probing pad being wider than an opening area of the second through-hole, the method includes: measuring current and voltage between the first electrode portion and the second electrode portion to determine a resistance component of a first remaining insulating layer remaining in the first through-hole and a resistance component of a second remaining insulating layer remaining in the second through-hole, thus inspecting a thickness of the first and the second remaining insulating layers.

In the method, the structure for inspection includes a conductor layer formed between the semiconductor substrate and the insulating layer, and the conductor layer is formed in a region including locations at which the first through-hole and the second through-hole are formed.

In the method, the structure for inspection includes a trench portion formed in the insulating layer between the first through-hole and the second through-hole.

In the method, the structure for inspection includes: a third through-hole formed in the insulating layer at a set distance from the first through-hole; a fourth through-hole formed in the insulating layer at a set distance from each of the third through-hole and the second through-hole; and a third electrode portion formed by filling the third through-hole and the fourth through-hole, the third electrode portion including a probing pad on the insulating layer, the probing pad being wider than an opening area of the third or fourth through-hole, wherein the conductor layer includes: a first conductor layer formed in a region including locations at which the first through-hole and the third through-hole are formed; and a second conductor layer insulated and isolated from the first conductor layer, the second conductor layer being formed in a region including locations at which the second through-hole and the fourth through-hole are formed.

Effects of Embodiments of the Invention

As described above, embodiments of the present invention may provide an excellent effect of providing the ability to check a remaining insulating layer in the through-hole non-destructively by forming a first through-hole and a second through-hole, forming a first electrode portion in the first through-hole, forming a second electrode portion in the second through-hole, and making it possible to measure current and voltage between the first electrode portion and the second electrode portion.

DETAILED DESCRIPTION OF ILLUSTRATIVE EMBODIMENTS

A structure for inspection according to an embodiment of the present invention will be described below.

Embodiment 1

Figure 1A:
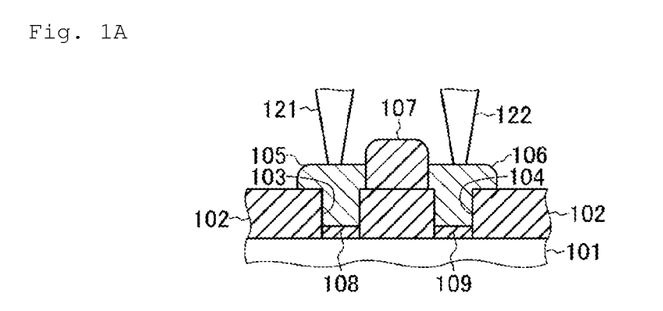
FIG. 1A is a cross-sectional view showing a configuration of a structure for inspection according to Embodiment 1 of the present invention.
Figure 1B:
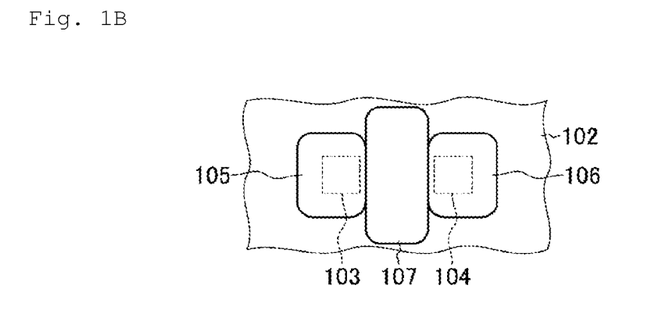
FIG. 1B is a plan view showing a configuration of a structure for inspection according to Embodiment 1 of the present invention.
Figure 1C:
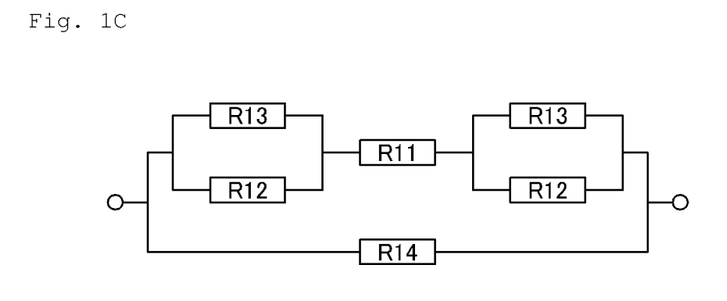
FIG. 1C is a circuit diagram showing an equivalent circuit of a structure for inspection according to Embodiment 1 of the present invention.

First, a structure for inspection according to an embodiment of the present invention will be described with reference to FIG. 1A, FIG. 1B, and FIG. 1C.

This structure for inspection includes an insulating layer 102 formed on the semiconductor substrate 101, and a first through-hole 103 and a second through-hole 104 formed in the insulating layer 102. The second through-hole 104 is formed in the insulating layer 102 at a set distance from the first through-hole 103. The first through-hole 103 and the second through-hole 104 have the same shape as the through-hole to be checked.

In addition, the structure for inspection includes a first electrode portion 105 and a second electrode portion 106. The first electrode portion 105 is formed by filling the first through-hole 103. The first electrode portion 105 includes a probing pad on the insulating layer 102. The probing pad is wider than an opening area of the first through-hole 103. The second electrode portion 106 is formed by filling the second through-hole 104. The second electrode portion 106 includes a probing pad on the insulating layer 102. The probing pad is wider than an opening area of the second through-hole 104.

In addition, the structure for inspection according to Embodiment 1 includes an isolation layer 107 between the first and second electrode portions 105 and 106. The isolation layer 107 is for insulating and isolating the electrode portions 105 and 106.

The above structure for inspection is a structure for inspection a first remaining insulating layer 108 remaining in the bottom portion of the first through-hole 103 and a second remaining insulating layer 109 remaining in the bottom portion of the second through-hole 104.

For example, a well-known manufacturing technology of a semiconductor device is used to form the insulating layer 102 on the semiconductor substrate 101 and form the first and second through-holes 103 and 104 on the insulating layer 102. Next, the isolation layer 107 is formed on the insulating layer 102 between the first and second through-holes 103 and 104. For example, the isolation layer 107 may be formed such as by applying an insulating paste. Next, an electrically conductive paste is applied to fill the first and second through-holes 103 and 104, thus forming the first and second electrode portions 105 and 106.

With the structure for inspection in Embodiment 1 fabricated as described above, the current and voltage between the first and second electrode portions 105 and 106 are measured to determine the resistance component of the first remaining insulating layer 108 remaining in the first through-hole 103 and the resistance component of the second remaining insulating layer 109 remaining in the second through-hole 104.

For example, the above resistance component may be measured by bringing a first probe 121 for measurement into contact with the probing pad of the first electrode portion 105 and bringing a second probe 122 for measurement into contact with the probing pad of the second electrode portion 106. The current and voltage between the first and second electrode portions 105 and 106 are measured to measure the resistance component of the first remaining insulating layer 108 and the resistance component of the second remaining insulating layer 109, thus inspecting the thickness of the first and the second remaining insulating layers.

Because the formation of a simple electrode with an electrically conductive paste may eliminate the necessity to bring the probe into direct contact with the remaining insulating layer, it may be possible to prevent the remaining insulating layer from being damaged on contact and the correct determination of the resistance from being unable to be performed. It may also be possible to measure the resistance in a fine through-hole pattern in which it is difficult to bring a general-purpose probe into direct contact with the remaining insulating layer. In addition, the formation of the isolation layer 107 with an insulating paste may prevent a short due to contact between the first and second electrode portions 105 and 106.

The insulating paste and electrically conductive paste may be applied using a general dispenser for small amount application. In addition, the isolation layer 107 may be formed of resist. In this case, the resist may be applied and patterned by lithography to form the isolation layer 107.

Next, the determination principle will be described with reference to an equivalent circuit shown in FIG. 1C. First, R11 is defined as the resistance component of the semiconductor substrate 101 in the substrate plane direction between the first and second electrode portions 105 and 106.

In addition, R12 is defined as the resistance component of the insulating layer 102 in the normal direction to the substrate plane in a region between the first and second electrode portions 105 and 106 and the semiconductor substrate 101.

In addition, R13 is defined as the resistance component of the first and second remaining insulating layers 108 and 109 in the normal direction to the substrate plane in a region between the first and second electrode portions 105 and 106 and the semiconductor substrate 101.

In addition, R14 is defined as the resistance component of the insulating layer 102 and isolation layer 107 in the plane direction of the semiconductor substrate 101 between the first and second electrode portions 105 and 106.

Although generally, an insulator does not conduct a current until application of a dielectric breakdown electric field strength, indeed, a current flows through defects or the like in the insulator. It may thus be possible to estimate the resistance of the insulating layer 102 and the first and second remaining insulating layers 108 and 109 from current and voltage measurement.

In a general through-hole opening process, the thickness of a remaining insulating layer is sufficiently less than that of the insulating layer, resulting in R13<<R12. Therefore, if the first and second through-holes 103 and 104 are successfully formed and the first and second remaining insulating layers 108 and 109 are absent, only $(1/R11+1/R14)^{-1}$ is detected. Meanwhile, if the first and second remaining insulating layers 108 and 109 are present, $\{1/(2R13+R11)+1/R14\}^{-1}$ is detected.

Here, R11 and R14 are determined by the following steps. First, before the insulating layer 102 is formed on the semiconductor substrate 101, two electrodes for inspection are formed in the surface at the same distance as that between the first and second through-holes 103 and 104. The resistance R11 is then determined by the above electrical measurement. Next, the electrodes for inspection are removed, the insulating layer 102 is formed on the semiconductor substrate 101, and two electrodes for inspection are formed in the surface at the same distance as that between the first and second through-holes 103 and 104. The resistance R14 is then determined by the above electrical measurement.

R11 and R14 thus determined are subtracted from the resistance measured using the structure for inspection in Embodiment 1. It may thus be possible to determine the presence or absence of the first and second remaining insulating layers 108 and 109 and determine R13 if the first and second remaining insulating layers 108 and 109 are present.

R13 is determined by the resistivity and thickness of the first and second remaining insulating layers 108 and 109 and the bottom area of the first and second through-holes 104 and 103. Therefore, by determining the resistivity of the insulating layer 102 formed on the semiconductor substrate 101 via a general electrical measurement, it may be possible to determine the thickness of the first and second remaining insulating layers 108 and 109.

Note that because R14 is neglected, the distance between the first and second electrode portions 105 and 106 may be configured to be 100 times or more the thickness of the first and second remaining insulating layers 108 and 109. In addition, in order to accurately determine the thickness of the first and second remaining insulating layers 108 and 109 from R13, a plurality of standard samples may be made, each including an insulating layer deposited with a different thickness, and the thickness dependence of the current-voltage characteristics may be pre-determined by a general electrical measurement.

For easy contact with a general prober, the dimension in plain view of the probing pad of the first and second electrode portions 105 and 106 is preferably a rectangle with a side of 100 μm or more, for example. In addition, the isolation layer 107 formed to prevent contact between the first and second electrode portions 105 and 106 is preferably formed thicker than the first and second electrode portions 105 and 106. For example, when the isolation layer 107 is formed with an insulating paste and the first and second electrode portions 105 and 106 are formed with an electrically conductive paste, each paste preferably has an application thickness of some 10 μm to some 100 μm. The application amount may be possible with a general dispenser for small amount application.

Note that the isolation layer 107 may be formed only in a region between the first and second through-holes 103 and 104. The isolation layer 107 may also be formed surrounding a region where the first and second electrode portions 105 and 106 are to be formed. In addition, in order to perform the above check in the surface of a wafer in which a plurality of chips are formed at the same time, for example, the structure for inspection according to the embodiment may be formed in each chip in the wafer.

As described above, according to Embodiment 1, it may be possible to determine the presence or absence and thickness of a remaining insulating layer in a fine through-hole without damaging the remaining insulating layer.

Embodiment 2

Figure 2A:
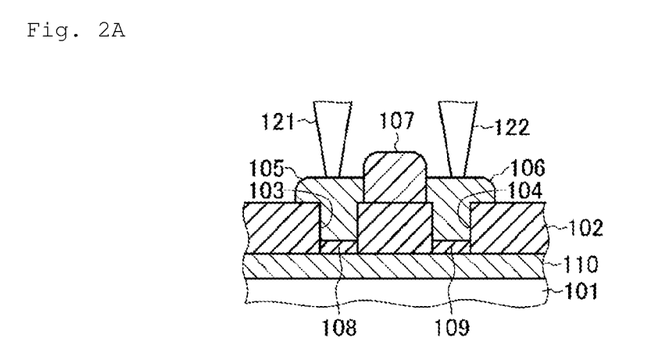
FIG. 2A is a cross-sectional view showing a configuration of a structure for inspection according to Embodiment 2 of the present invention.
Figure 2B:
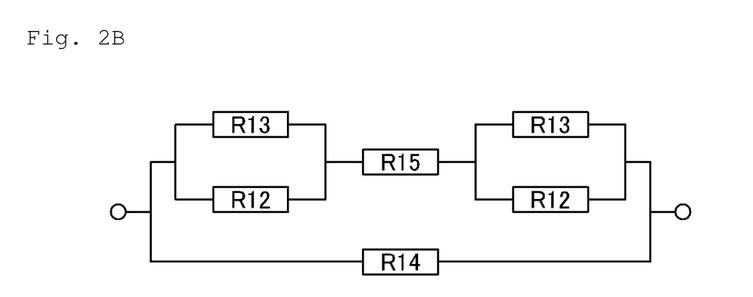
FIG. 2B is a circuit diagram showing an equivalent circuit of a structure for inspection according to Embodiment 2 of the present invention.

Next, an Embodiment 2 of the present invention will be described with reference to FIG. 2A and FIG. 2B. In Embodiment 2, the structure for inspection in the above Embodiment 1 is added with a conductor layer no. The conductor layer no is formed between the semiconductor substrate 101 and the insulating layer 102. In Embodiment 2, the conductor layer no is formed across the semiconductor substrate 101.

Also in Embodiment 2, the current and voltage between the first and second electrode portions 105 and 106 are measured to determine the resistance component of the first remaining insulating layer 108 remaining in the first through-hole 103 and the resistance component of the second remaining insulating layer 109 remaining in the second through-hole 104. For example, the resistance component is measured by bringing the first probe 121 for measurement into contact with the probing pad of the first electrode portion 105 and bringing a second probe 122 for measurement into contact with the probing pad of the second electrode portion 106.

Next, the determination principle will be described with reference to an equivalent circuit shown in FIG. 2B. First, R12, R13, and R14 are the same as those in the above Embodiment 1. In Embodiment 2, R15 is defended as the resistance component of the conductor layer no in the substrate plane direction between the first and second electrode portions 105 and 106.

As in Embodiment 1, if the first and second through-holes 103 and 104 are successfully formed and the first and second remaining insulating layers 108 and 109 are absent, only $(1/R15+1/R14)^{-1}$ is detected. Meanwhile, if the first and second remaining insulating layers 108 and 109 are present, $\{1/(2R13+R15)+1/R14\}^{-1}$ is detected.

Here, while R15 and R14 may be subtracted as in Embodiment 1, the resistance of the conductor layer no is lower than those of the first and second remaining insulating layers 108 and 109, and thus the resistance of the first and second remaining insulating layers 108 and 109 may be detected more directly than in Embodiment 1. The result is that the thickness of the first and second remaining insulating layers 108 and 109 may be measured more accurately.

R13 is determined by the resistivity and thickness of the first and second remaining insulating layers 108 and 109 and the bottom area of the first and second through-holes 104 and 103. Therefore, by determining the resistivity of the insulating layer 102 via a general electrical measurement, it may be possible to determine the thickness of the first and second remaining insulating layers 108 and 109.

As described above, according to Embodiment 2, it may be possible to determine the presence or absence and thickness of a remaining insulating layer in a fine through-hole without damaging the remaining insulating layer.

Embodiment 3

Figure 3A:
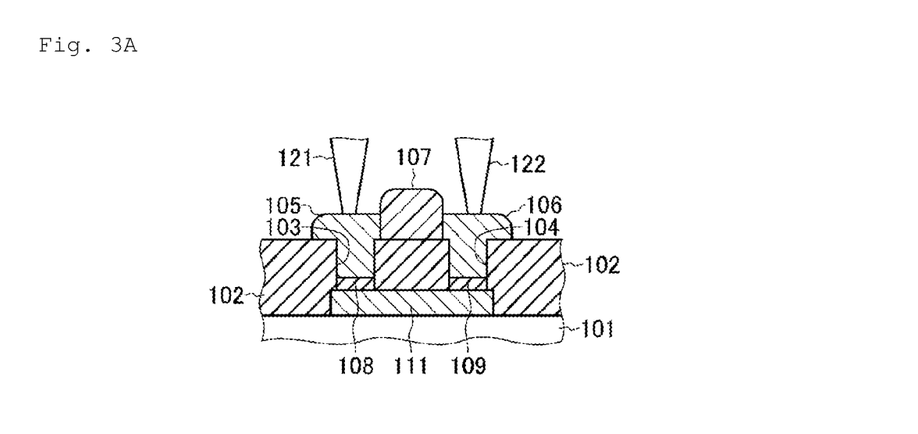
FIG. 3A is a cross-sectional view showing a configuration of a structure for inspection according to an Embodiment 3 of the present invention.
Figure 3B:
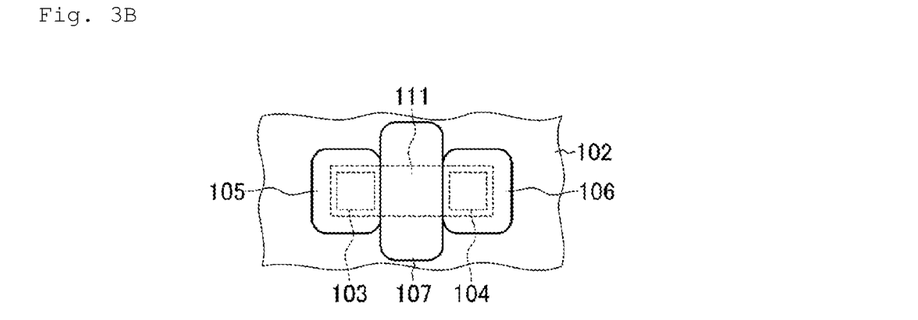
FIG. 3B is a plan view showing a configuration of a structure for inspection according to Embodiment 3 of the present invention.
Figure 3C:
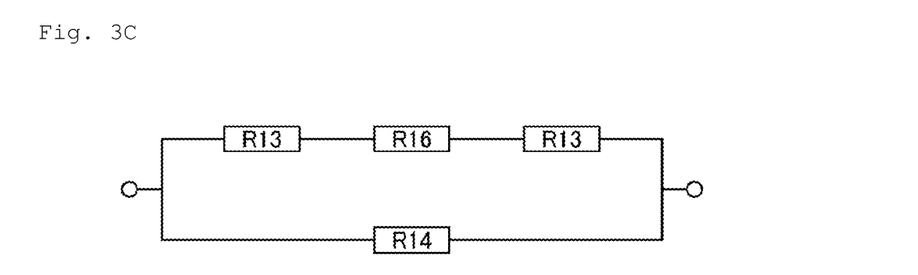
FIG. 3C is a circuit diagram showing an equivalent circuit of a structure for inspection according to Embodiment 3 of the present invention.

Next, an Embodiment 3 of the present invention will be described with reference to FIG. 3A, FIG. 3B, and FIG. 3C. In Embodiment 3, the structure for inspection in the above Embodiment 1 is added with a conductor layer in. The conductor layer 111 is formed between the semiconductor substrate 101 and the insulating layer 102. The conductor layer 111 is formed in a predetermined region including locations at which the first and second through-holes 103 and 104 are formed.

Also in Embodiment 3, the current and voltage between the first and second electrode portions 105 and 106 are measured to determine the resistance component of the first remaining insulating layer 108 remaining in the first through-hole 103 and the resistance component of the second remaining insulating layer 109 remaining in the second through-hole 104. For example, the resistance component is measured by bringing the first probe 121 for measurement into contact with the probing pad of the first electrode portion 105 and bringing the second probe 122 for measurement into contact with the probing pad of the second electrode portion 106.

Next, the determination principle will be described with reference to an equivalent circuit shown in FIG. 3C. First, R13 and R14 are the same as those in the above embodiments 1 and 2. In Embodiment 3, R16 is defined as the resistance component of the conductor layer 111 in the substrate plane direction.

As in Embodiment 2, if the first and second through-holes 103 and 104 are successfully opened and the first and second remaining insulating layers 108 and 109 are absent, only $(1/R16+1/R14)^{-1}$ is detected. Meanwhile, if the remaining insulating layers are present, $(1/(2R13+R16)+1/R14)^{-1}$ is detected. Therefore, in the same manner as Embodiment 2, R16 and R14 may be subtracted to determine R13.

R13 is determined by the resistivity and thickness of the first and second remaining insulating layers 108 and 109 and the bottom area of the first and second through-holes 104 and 103. Therefore, by determining the resistivity of the insulating layer 102 via a general electrical measurement, it may be possible to determine the thickness of the first and second remaining insulating layers 108 and 109.

In the embodiments 1 and 2, if the first and second remaining insulating layers 108 and 109 are thick or the formation region of the first and second electrode portions 105 and 106 is wide, R12 may not be neglected. In contrast, in Embodiment 3, by not forming a conductor below the insulating layer 102 in a region where the first and second through-holes 104 and 103 are not disposed, a leak current in the normal direction to the substrate plane in the insulating layer 102 is reduced. Thus, the effect of R12 may be eliminated, resulting in that the thickness of the first and second remaining insulating layers 108 and 109 may be measured more accurately.

As described above, according to Embodiment 3, it may be possible to determine the presence or absence and thickness of a remaining insulating layer in a fine through-hole without damaging the remaining insulating layer.

Embodiment 4

Figure 4A:
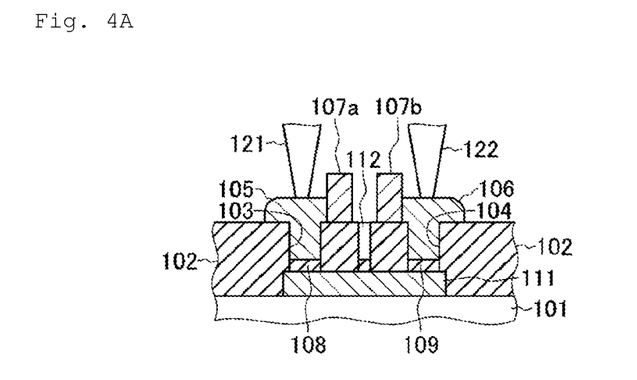
FIG. 4A is a cross-sectional view showing a configuration of a structure for inspection according to an Embodiment 4 of the present invention.
Figure 4B:
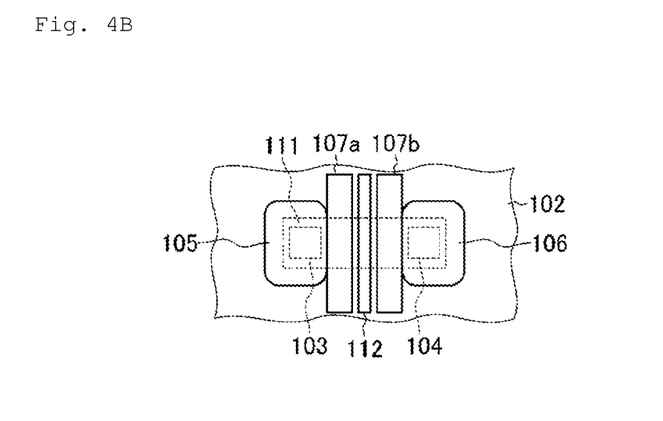
FIG. 4B is a plan view showing a configuration of a structure for inspection according to Embodiment 4 of the present invention.
Figure 4C:
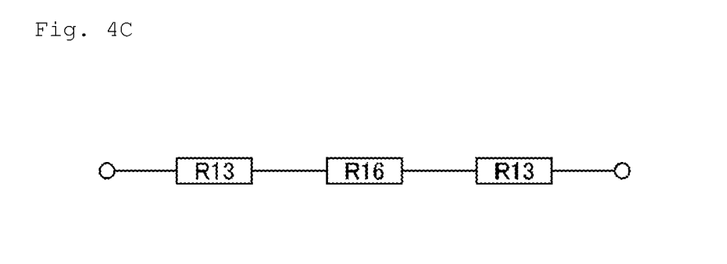
FIG. 4C is a circuit diagram showing an equivalent circuit of a structure for inspection according to Embodiment 4 of the present invention.

Next, an Embodiment 4 of the present invention will be described with reference to FIG. 4A, FIG. 4B, and FIG. 4C. In Embodiment 4, the structure for inspection in the above Embodiment 3 is added with a trench portion 112. The trench portion 112 is formed in the insulating layer 102 between the first and second through-holes 103 and 104. In addition, in Embodiment 4, an isolation layer 107a and an isolation layer 107b are formed on the insulating layer 102 to sandwich the trench portion 112.

For example, in the process of forming the first and second through-holes 103 and 104 in the insulating layer 102, in addition to the opening for forming the first and second through-holes 103 and 104, a mask pattern including an opening for forming the trench portion 112 may be used to etch the insulating layer 102.

Also in Embodiment 4, the current and voltage between the first and second electrode portions 105 and 106 are measured to determine the resistance component of the first remaining insulating layer 108 remaining in the first through-hole 103 and the resistance component of the second remaining insulating layer 109 remaining in the second through-hole 104. For example, the resistance component is measured by bringing the first probe 121 for measurement into contact with the probing pad of the first electrode portion 105 and bringing the second probe 122 for measurement into contact with the probing pad of the second electrode portion 106.

Next, the determination principle will be described with reference to an equivalent circuit shown in FIG. 4C. As in Embodiment 3, if the first and second through-holes 103 and 104 are successfully opened and the first and second remaining insulating layers 108 and 109 are absent, only $(1/R16+1/R14)^{-1}$ is detected. Meanwhile, if the remaining insulating layers are present, $(1/(2R13+R16)+1/R14)^{-1}$ is detected.

R13 is determined by the resistivity and thickness of the first and second remaining insulating layers 108 and 109 and the bottom area of the first and second through-holes 104 and 103. Therefore, by determining the resistivity of the insulating layer 102 via a general electrical measurement, it may be possible to determine the thickness of the first and second remaining insulating layers 108 and 109.

In the above embodiments, if the distance between the first and second electrode portions 105 and 106 is narrow, it may be impossible to neglect R14. In contrast, in Embodiment 4, the trench portion 112 for isolation is provided between the first and second electrode portions 105 and 106 to reduce a leak current through the insulating layer 102 and isolation layers 107a and 107b in the substrate plane direction between the first and second electrode portions 105 and 106. Thus, the effect of R14 may be eliminated, resulting in that the thickness of the first and second remaining insulating layers 108 and 109 may be measured more accurately.

As described above, according to Embodiment 4, it may be possible to determine the presence or absence and thickness of a remaining insulating layer in a fine through-hole without damaging the remaining insulating layer.

Embodiment 5

Figure 5A:
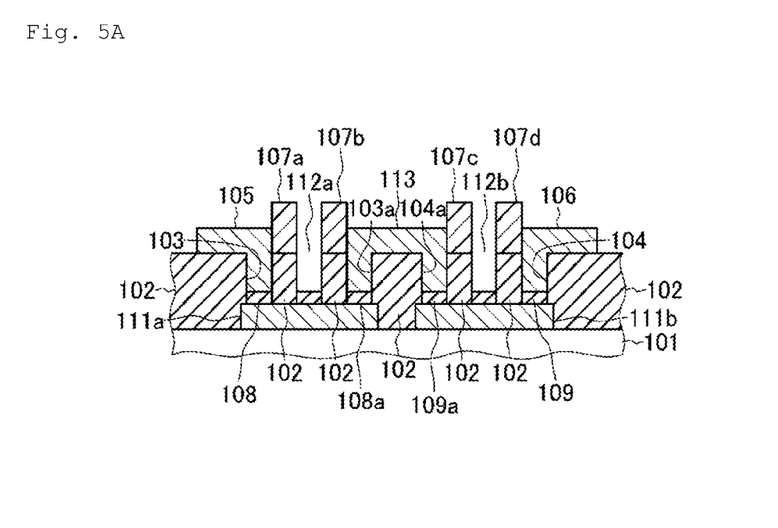
FIG. 5A is a cross-sectional view showing a configuration of a structure for inspection according to an Embodiment 5 of the present invention.
Figure 5B:
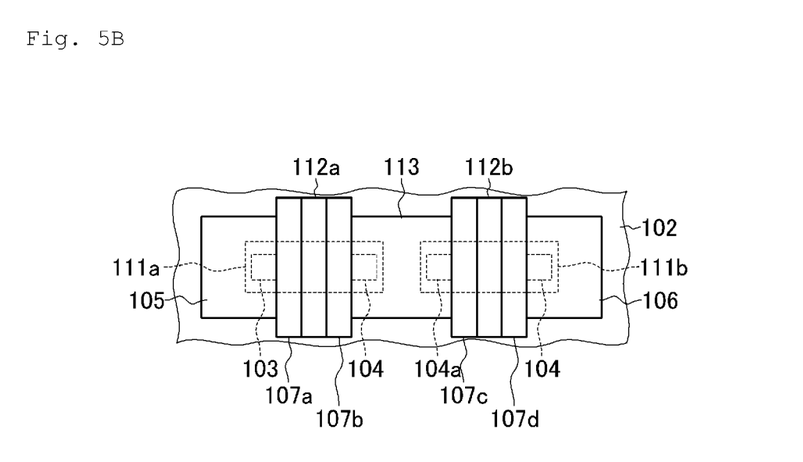
FIG. 5B is a plan view showing a configuration of a structure for inspection according to Embodiment 5 of the present invention.
Figure 5C:
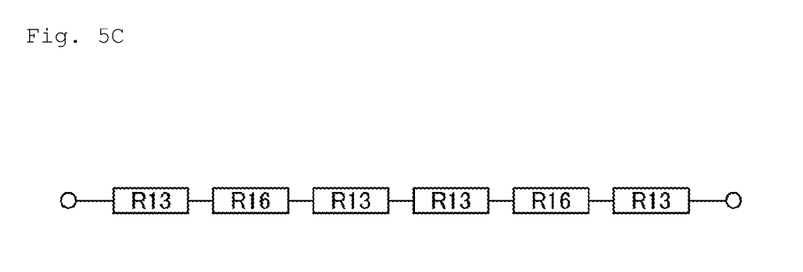
FIG. 5C is a circuit diagram showing an equivalent circuit of a structure for inspection according to Embodiment 5 of the present invention.

Next, a structure for inspection according to an Embodiment 5 of the present invention will be described with reference to, FIG. 5A, FIG. 5B, and FIG. 5C.

The structure for inspection in Embodiment 5 further includes, in addition to the structure for inspection in the above Embodiment 3, a third through-hole 103a, a fourth through-hole 104a, and a third electrode portion 113.

The third through-hole 103a is formed in the insulating layer 102 at a set distance from the first through-hole 103. The fourth through-hole 104a is formed in the insulating layer 102 at a set distance from each of the third and second through-holes 103a and 104.

The third electrode portion 113 is formed by filling the third and fourth through-holes 103a and 104a. The third electrode portion 113 includes a probing pad on the insulating layer 102. The probing pad is wider than an opening area of the third or fourth through-hole 103a or 104a.

In addition, in Embodiment 5, the structure for inspection includes a first conductor layer 111a formed in a region including locations at which the first and third through-holes 103 and 103a are formed, and a second conductor layer 111b insulated and isolated from the first conductor layer ma, the second conductor layer 111b being formed in a region including locations at which the second and fourth through-holes 104 and 104a are formed.

In addition, in Embodiment 5, the structure for inspection includes a trench portion 112a in the insulating layer 102 between the first and third through-holes 103 and 103a and a trench portion 112b between the second and fourth through-holes 104 and 104a. The trench portions 112a and 112b are formed in the insulating layer 102 in the same manner as each through-hole.

In addition, in Embodiment 5, the isolation layers 107a and 107b are formed on the insulating layer 102 to sandwich the trench portion 112a and the isolation layers 107c and 107d are formed on the insulating layer 102 to sandwich the trench portion 112b.

In Embodiment 5, the third and fourth through-holes 103a and 104a are connected via the third electrode portion 113. The Embodiment 5 is configured to include the structures for inspection in Embodiment 4 that are electrically connected in series.

Also in Embodiment 5, the current and voltage between the first and second electrode portions 105 and 106 are measured to determine the resistance component of the first remaining insulating layer 108 remaining in the first through-hole 103, the second remaining insulating layer 109 remaining in the second through-hole 104, the third remaining insulating layer 108a remaining in the third through-hole 103a, and the fourth remaining insulating layer 109a remaining in the fourth through-hole 104a. For example, the resistance component is measured by bringing the first probe 121 for measurement into contact with the probing pad of the first electrode portion 105 and bringing the second probe 122 for measurement into contact with the probing pad of the second electrode portion 106.

Next, the determination principle will be described with reference to an equivalent circuit shown in FIG. 5C. If the first, second, third, and fourth through-holes 103, 104, 103a, and 104a are successfully opened and the first, second, third, and fourth remaining insulating layers 108, 109, 108a, and 109a are absent, only 2×R16 is detected.

Meanwhile, if the first, second, third, and fourth remaining insulating layers 108, 109, 108a, and 109a are present, 4×R13 is detected. R13 is determined by the resistivity and thickness of the first, second, third, and fourth remaining insulating layers 108, 109, 108a, and 109a and the bottom area of the first, second, third, and fourth through-holes 103, 104, 103a, and 104a. Therefore, by determining the resistivity of the insulating layer 102 via a general electrical measurement, the thickness of the first, second, third, and fourth remaining insulating layers 108, 109, 108a, and 109a may be determined.

Here, if the first, second, third, and fourth remaining insulating layers 108, 109, 108a, and 109a are thin, R13 may be too small to be detected. In contrast, in Embodiment 5, the first, second, third, and fourth remaining insulating layers 108, 109, 108a, and 109a are electrically connected in series to detect the resistance more accurately, resulting in that the thickness of the first, second, third, and fourth remaining insulating layers 108, 109, 108a, and 109a may be measured more accurately.

Note that although in Embodiment 5, four through-holes are formed and electrically connected in series to measure the resistance more accurately, five or more through-holes may be formed and electrically connected to measure the resistance even more accurately.

As described above, according to Embodiment 5, it may be possible to determine the presence or absence and thickness of a remaining insulating layer in a fine through-hole without damaging the remaining insulating layer.

As described above, embodiments of the present invention may provide the ability to check a remaining insulating layer in the through-hole non-destructively by forming a first through-hole and a second through-hole, forming a first electrode portion in the first through-hole, forming a second electrode portion in the second through-hole, and making it possible to measure current and voltage between the first electrode portion and the second electrode portion.

Note that the present invention is not limited to the above embodiments, and it is apparent that various modifications and combinations may be made by one of ordinary skill in the art without departing from the spirit and scope of the present invention.

REFERENCE SIGNS LIST

101 Semiconductor substrate
102 Insulating layer
103 First through-hole
104 Second through-hole
105 First electrode portion
106 Second electrode portion
107 Isolation layer
108 First remaining insulating layer
109 Second remaining insulating layer
121 First probe
122 Second probe.

The invention claimed is:
1. A structure for inspection comprising:
an insulating layer on a semiconductor substrate, the insulating layer comprising a trench portion;
a first through-hole in the insulating layer;
a second through-hole in the insulating layer, the second through-hole is disposed at a set distance away from the first through-hole, wherein the trench portion is between the first through-hole and the second through-hole;
a first electrode portion filling the first through-hole, the first electrode portion including a first probing pad on the insulating layer, the first probing pad being wider than an opening area of the first through-hole;
a second electrode portion filling the second through-hole, the second electrode portion including a second probing pad on the insulating layer, the second probing pad being wider than an opening area of the second through-hole; and
an isolation layer over the insulating layer, wherein the first electrode portion and the second electrode portion are disposed on opposing sides of the isolation layer.
2. The structure for inspection according to claim 1, further comprising:
a conductor layer between the semiconductor substrate and the insulating layer, wherein the first through-hole and the second through-hole are disposed directly over the conductor layer.
3. The structure for inspection according to claim 2, further comprising:
a third through-hole in the insulating layer and disposed at a set distance away from the first through-hole;
a fourth through-hole in the insulating layer and disposed at a set distance away from each of the third through-hole and the second through-hole; and a third electrode portion filling the third through-hole and the fourth through-hole, the third electrode portion including a probing pad on the insulating layer, the probing pad being wider than an opening area of the third through-hole or the fourth through-hole, wherein the conductor layer includes:
  a first conductor layer, wherein the first through-hole and the third through-hole are disposed directly over the first conductor layer; and
  a second conductor layer insulated and isolated from the first conductor layer, wherein the second through-hole and the fourth through-hole are disposed directly over the second conductor layer.

4. The structure for inspection according to claim 1, wherein the isolation layer is an insulating paste.

5. The structure for inspection according to claim 1, wherein the first electrode portion and the second electrode portion are each a conductive paste.

6. The structure for inspection according to claim 1, wherein the isolation layer extends continuously from a sidewall of the first probing pad to a sidewall of the second probing pad.

7. A method of inspecting a structure for inspection, the method comprising:
  measuring current and voltage between a first electrode portion and a second electrode portion to determine a resistance component of a first remaining insulating layer remaining in a first through-hole and a resistance component of a second remaining insulating layer remaining in a second through-hole to determine a first thickness of the first remaining insulating layer and a second thickness of the second remaining insulating layer, wherein the structure for inspection comprises:
  an insulating layer on a semiconductor substrate and comprising a trench portion between the first through-hole and the second through-hole, wherein the first through-hole and the second through-hole are disposed in the insulating layer, wherein the second through-hole is disposed at a set distance away from the first through-hole;
  the first electrode portion filling the first through-hole, the first electrode portion including a first probing pad on the insulating layer, the first probing pad being wider than an opening area of the first through-hole;
  the second electrode portion filling the second through-hole, the second electrode portion including a second probing pad on the insulating layer, the second probing pad being wider than an opening area of the second through-hole; and
  an isolation layer over the insulating layer, wherein the first electrode portion and the second electrode portion are disposed on opposing sides of the isolation layer.

8. The method according to claim 7, wherein the structure for inspection includes a conductor layer formed between the semiconductor substrate and the insulating layer, and the first through-hole and the second through-hole are disposed directly over the conductor layer.

9. The method according to claim 8, the structure for inspection further includes:
  a third through-hole in the insulating layer and disposed at a set distance away from the first through-hole;
  a fourth through-hole in the insulating layer and disposed at a set distance away from each of the third through-hole and the second through-hole; and
  a third electrode portion filling the third through-hole and the fourth through-hole, the third electrode portion including a probing pad on the insulating layer, the probing pad being wider than an opening area of the third through-hole or the fourth through-hole, wherein the conductor layer includes:
    a first conductor layer, wherein the first through-hole and the third through-hole are disposed directly over the first conductor layer; and
    a second conductor layer insulated and isolated from the first conductor layer, wherein the second through-hole and the fourth through-hole are disposed directly over the second conductor layer.

10. The method according to claim 7 further comprising forming the first through-hole and the second through-hole by etching the insulating layer, wherein etching the insulating layer comprises leaving the first remaining insulating layer and the second remaining insulating layer in the first through-hole and the second through-hole.

11. The method according to claim 7, wherein the isolation layer is an insulating paste.

12. The method according to claim 7, wherein the first electrode portion and the second electrode portion are each a conductive paste.

13. The method according to claim 7, wherein the isolation layer extends continuously from a sidewall of the first probing pad to a sidewall of the second probing pad.

* * * * *